(12) United States Patent
Lee et al.

(10) Patent No.: US 11,283,048 B2
(45) Date of Patent: Mar. 22, 2022

(54) ORGANIC ELECTRONIC DEVICE

(71) Applicant: LG CHEM, LTD., Seoul (KR)

(72) Inventors: Seung Min Lee, Daejeon (KR); So Young Kim, Daejeon (KR); Se Woo Yang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 147 days.

(21) Appl. No.: 16/954,950

(22) PCT Filed: Dec. 18, 2018

(86) PCT No.: PCT/KR2018/016099
§ 371 (c)(1),
(2) Date: Jun. 17, 2020

(87) PCT Pub. No.: WO2019/124923
PCT Pub. Date: Jun. 27, 2019

(65) Prior Publication Data
US 2020/0335726 A1    Oct. 22, 2020

(30) Foreign Application Priority Data

Dec. 18, 2017 (KR) .................. 10-2017-0174039

(51) Int. Cl.
*H01L 51/52* (2006.01)
*H01L 51/00* (2006.01)
*H01L 51/56* (2006.01)

(52) U.S. Cl.
CPC ...... *H01L 51/5253* (2013.01); *H01L 51/0035* (2013.01); *H01L 51/5259* (2013.01); *H01L 51/56* (2013.01)

(58) Field of Classification Search
CPC ....... H01L 51/5253–5256; H01L 51/56; H01L 51/5259; H01L 51/0035
See application file for complete search history.

(56) References Cited

U.S. PATENT DOCUMENTS

| | | | |
|---|---|---|---|
| 8,785,964 B2* | 7/2014 | Shitagaki | H01L 51/5218 257/100 |
| 9,871,224 B2 | 1/2018 | Kim et al. | |
| 10,141,543 B2* | 11/2018 | Cho | H01L 51/524 |
| 2016/0118620 A1* | 4/2016 | Yoo | H01L 51/5259 257/40 |
| 2016/0126492 A1 | 5/2016 | Kyoung | |
| 2016/0133872 A1* | 5/2016 | Yoo | H01L 51/004 257/40 |

(Continued)

FOREIGN PATENT DOCUMENTS

| | | |
|---|---|---|
| CN | 104024360 A | 9/2014 |
| JP | 11020096 A | 1/1999 |

(Continued)

*Primary Examiner* — Shaun M Campbell
(74) *Attorney, Agent, or Firm* — Dentons US LLP

(57) ABSTRACT

The present application relates to an organic electronic device, and provides the organic electronic device including an encapsulating structure capable of effectively blocking water or oxygen introduced from the outside into the organic electronic device, thereby securing the lifetime of the organic electronic device and implementing endurance reliability of the encapsulating structure at high temperature and high humidity, and having high shape retention characteristics.

20 Claims, 1 Drawing Sheet

(56) References Cited

U.S. PATENT DOCUMENTS

| | | | |
|---|---|---|---|
| 2017/0040570 A1* | 2/2017 | Kim | H01L 51/56 |
| 2018/0118984 A1* | 5/2018 | Lee | C09J 123/22 |
| 2019/0123299 A1* | 4/2019 | Lee | C09J 7/28 |

FOREIGN PATENT DOCUMENTS

| | | |
|---|---|---|
| JP | 2006019649 A | 1/2006 |
| JP | 2009047879 A | 3/2009 |
| JP | 2015072890 A | 4/2015 |
| KR | 10-2009-0019690 A | 2/2009 |
| KR | 10-2015-0024757 A | 3/2015 |
| KR | 10-2016-0052955 A | 5/2016 |
| KR | 10-2016-0056391 A | 5/2016 |
| KR | 10-2016-0114541 A | 10/2016 |
| KR | 10-2017-0113470 A | 10/2017 |
| TW | 201708473 A | 3/2017 |
| WO | 2016153298 A1 | 9/2016 |
| WO | 2017171518 A1 | 10/2017 |

* cited by examiner

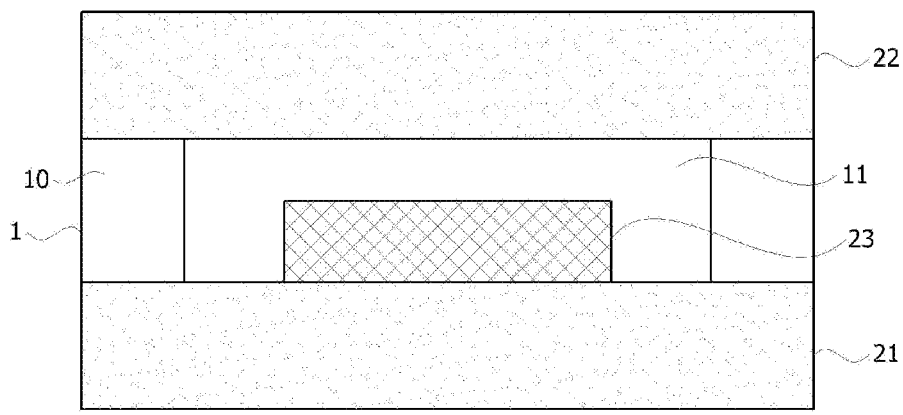

ORGANIC ELECTRONIC DEVICE

CROSS-REFERENCE TO RELATED APPLICATIONS

This application is a National Phase entry pursuant to 35 U.S.C. § 371 of PCT/KR2018/016099 filed on Dec. 18, 2018, and claims the benefit of priority based on Korean Patent Application No. 10-2017-0174039 filed on Dec. 18, 2017, the disclosure of which is incorporated herein by reference in its entirety.

TECHNICAL FIELD

The present application relates to an organic electronic device and a method for manufacturing the organic electronic device.

BACKGROUND ART

An organic electronic device (OED) means a device comprising a layer of an organic material that generates an alternating current of electric charges using holes and electrons, and an example thereof may include a photovoltaic device, a rectifier, a transmitter and an organic light emitting diode (OLED), and the like.

The organic light emitting diode (OLED) among the organic electronic devices has lower power consumption and faster response speed, than conventional light sources, and is advantageous for thinning display devices or illuminations. In addition, the OLED has excellent space utilization, so that it is expected to be applied in various fields covering various portable devices, monitors, notebooks, and televisions.

In commercialization and application expansion of OLEDs, the most important problem is a durability problem. Organic materials and metal electrodes, and the like, contained in OLEDs are very easily oxidized by external factors such as moisture. Thus, products comprising OLEDs are highly sensitive to environmental factors. Accordingly, various methods have been proposed to effectively block penetration of oxygen or moisture from the outside into organic electronic devices such as OLEDs.

DISCLOSURE

Technical Problem

The present application provides an organic electronic device which can form an encapsulating structure capable of effectively blocking water or oxygen introduced from the outside into the organic electronic device, thereby securing the lifetime of the organic electronic device and realizing endurance reliability of the encapsulating structure at high temperature and high humidity, and has high shape retention characteristics.

Technical Solution

The present application relates to an organic electronic device. The organic electronic device may comprise, for example, an encapsulating structure that seals or encapsulates an element such as an OLED. In one example, the organic electronic device of the present application has an encapsulating structure comprising a side encapsulation layer for sealing or encapsulating at least one side of an organic electronic element, and a top encapsulation layer for sealing or encapsulating the entire surface of the organic electronic element.

In this specification, the term "organic electronic device" means an article or device having a structure comprising an organic material layer that generates an alternating current of electric charges using holes and electrons between a pair of electrodes facing each other, and an example thereof may include a photovoltaic device, a rectifier, a transmitter and an organic light emitting diode (OLED), and the like, but is not limited thereto. In one example of the present application, the organic electronic device may be an OLED.

An exemplary organic electronic device may comprise a substrate (21) on which an organic electronic element (23) is formed; a top encapsulation layer (11) for encapsulating the entire surface of the organic electronic element (23); and a side encapsulation layer (10) disposed on the edge of the substrate (21). The side encapsulation layer may have a tensile modulus at 25° C. after curing in a range of 0.05 to 100 MPa, 0.1 to 95 MPa, 0.5 to 83 MPa, 0.8 to 75 MPa, 1.0 to 72 MPa, or 1.8 to 69 MPa. Also, the top encapsulation layer may have a tensile modulus at 25° C. after curing in a range of 100 MPa or more, 100 to 2000 MPa, 300 to 1500 MPa, 500 to 1300 MPa, 800 to 1200 MPa or 900 to 1150 MPa. Furthermore, an encapsulating composition constituting the side encapsulation layer may have a viscosity, as measured at 25° C. and 0.5 $s^{-1}$ before curing, in a range of 300,000 cP or more, 330,000 to 1,000,000 cP, 350,000 to 800,000 cP or 370,000 to 600,000 cP. In addition, an encapsulating composition constituting the top encapsulation layer may have a viscosity, as measured at 25° C. and 0.5 $s^{-1}$, of 5000 cP or less, 1 to 3000 cP, 10 to 2000 cP, 30 to 1000 cP, 50 to 900 cP or 70 to 500 cP.

In providing an encapsulating structure for encapsulating an organic electronic element, the present application constitutes a top encapsulation layer and a side encapsulation layer separately and adjusts a viscosity or tensile modulus range of each layer, whereby the mixing of the top encapsulation layer which has to maintain transparency and the side encapsulation layer which maintains moisture barrier properties can be suppressed, foam inhibition and wettability during a lamination process can be realized, and after curing of the encapsulating structure, the lifting of the structure at high temperature and high humidity can be suppressed.

In an embodiment of the present application, the ratio of the viscosity of the top encapsulation layer composition to the viscosity of the side encapsulation layer composition may be in a range of 1.5 to 15, 1.6 to 13, 1.7 to 11, 1.8 to 9, or 1.9 to 7. The ratio of the tensile modulus of the top encapsulation layer to the tensile modulus of the side encapsulation layer may be in a range of 5 to 400, 8 to 390, 10 to 380, 11 to 370, 12 to 360, 13 to 350, or 14 to 330.

In one example, the present application may comprise a moisture adsorbent, which is described below, in the side encapsulation layer, where the moisture adsorbent means a material capable of removing moisture or oxygen through a chemical reaction with the moisture or oxygen penetrated into the encapsulating structure. Generally, when a moisture adsorbent reacts with moisture in an encapsulating structure, the volume expands as it reacts with moisture, resulting in stress. Besides, the encapsulating structure of the present application can comprise a large amount of the moisture adsorbent in the side encapsulation layer, which is the edge part of the substrate on which the organic electronic element is formed, as described below, and thus when it does not have sufficient elasticity to relieve the expansion stress due to moisture adsorption, the encapsulating structure may peel off from the adherend or the encapsulating structure may be destroyed. Accordingly, the present application realizes the shape retention characteristics of the encapsulating structure and the durability at high temperature and high humidity under severe conditions while realizing moisture blocking performance by controlling the viscosity or the tensile modulus value of the encapsulating structure, or the ratio thereof.

The side encapsulation layer and the top encapsulation layer may each comprise an encapsulating composition. The compositions may be referred to as a side encapsulation layer composition and a top encapsulation layer composition, respectively. Also, when referred to herein as an encapsulating composition, it may be a description of matters concerning the side encapsulation layer and/or the top encapsulation layer.

Hereinafter, the side encapsulation layer composition will be described.

The side encapsulation layer encapsulating composition may comprise an olefin-based resin, a curable oligomer and a curable monomer. The curable oligomer may be included in an amount of 20 to 90 parts by weight relative to 100 parts by weight of the olefin-based resin. The lower limit of the curable oligomer is not particularly limited, which may be, for example, 22 parts by weight or more, 25 parts by weight or more, 28 parts by weight or more, 29 parts by weight or more, 30 parts by weight or more, 50 parts by weight or more, or 65 parts by weight or more. The upper limit value of the curable oligomer may be, for example, 80 parts by weight or less, 75 parts by weight or less, 73 parts by weight or less, 68 parts by weight or less, or 50 parts by weight or less. Here, the curable oligomer may be a compound having a glass transition temperature after curing of 85° C. or lower, 55° C. or lower, 50° C. or lower, 30° C. or lower, 0° C. or lower, $-10$° C. or lower, $-18$° C. or lower, $-25$° C. or lower, or $-30$° C. or lower, or $-40$° C. or lower, where the lower limit is not particularly limited, but may be $-100$° C. or higher. In one example, the compositions of the present application may not comprise a curable oligomer having a glass transition temperature of greater than 85° C., greater than 55° C., greater than 30° C., greater than 0° C., or greater than $-10$° C. The glass transition temperature may be measured for the cured product of the curable oligomer alone. In the encapsulating composition formulation of the olefin-based resin, the curable oligomer and the curable monomer, the present application can realize the shape retention characteristics and the moisture- and heat-resistant durability under severe conditions while realizing moisture barrier performance by controlling the content and glass transition temperature ranges of the curable oligomer.

In this specification, the glass transition temperature may be a physical property after curing. Unless otherwise specified herein, the glass transition temperature may mean a glass transition temperature after curing it at any temperature between 50 and 300° C. for 20 minutes to 200 minutes; a glass transition temperature after irradiating it with ultraviolet rays at an irradiance level of 1 J/cm$^2$ to 10 J/cm$^2$; or a glass transition temperature after the ultraviolet ray irradiation, followed by the thermal curing.

In an embodiment of the present application, the olefin-based resin in the composition of the side encapsulation layer may be an olefin-based resin containing one or more reactive functional groups. In one example, the olefin-based resin may be a hydrophobic resin, and may have a water vapor transmission rate of 50 g/m$^2$·day or less. Considering that the encapsulating composition of the present application is applied to seal or encapsulate an organic electronic device, it can provide an excellent moisture barrier property by comprising the olefin-based resin satisfying the above water vapor transmission rate range. In this specification, the "resin having a water vapor transmission rate of 50 g/m$^2$·day or less" may mean a resin that in a state where the resin is prepared in the form of a film formed of a resin layer having any one of 5 to 100 μm, the water vapor transmission rate measured in the thickness direction of the film is 50 g/m$^2$·day or less. The water vapor transmission rate is measured under 100° F. and 100% relative humidity, which may be 50 g/m$^2$·day or less, 40 g/m$^2$·day or less, 30 g/m$^2$·day or less, 20 g/m$^2$·day or less, or 10 g/m$^2$·day or less. The lower the water vapor transmission rate is, the better the moisture barrier property can be exhibited, and thus the lower limit is not particularly limited, but may be, for example, 0 g/m$^2$·day or 0.1 g/m$^2$·day.

Specifically, an exemplary olefin-based resin of the present application comprises an olefin-based resin derived from a mixture of monomers, where the mixture may have at least an isoolefin monomer component having 4 to 7 carbon atoms or a multi-olefin monomer component. The isoolefin may be present, for example, in a range of 70 to 100 wt %, or 85 to 99.5 wt %, based on the total monomer weight. The multi-olefin-derived component may be present in a range of 0.5 to 30 wt %, 0.5 to 15 wt %, or 0.5 to 8 wt %.

The isoolefin may be exemplified by, for example, isobutylene, 2-methyl-1-butene, 3-methyl-1-butene, 2-methyl-2-butene, 1-butene, 2-butene, methyl vinyl ether, indene, vinyltrimethylsilane, hexene, or 4-methyl-1-pentene. The multi-olefin may have 4 to 14 carbon atoms and may be exemplified by, for example, isoprene, butadiene, 2,3-dimethyl-1,3-butadiene, myrcene, 6,6-dimethyl-fulvene, hexadiene, cyclopentadiene, or piperylene. Other polymerizable monomers, such as styrene and dichlorostyrene, can also be homopolymerized or copolymerized.

In the present application, the olefin-based resin may comprise an isobutylene-based homopolymer or copolymer. As mentioned above, the isobutylene-based olefin-based resin or polymer may mean an olefin-based resin or polymer comprising 70 mol % or more of repeating units from isobutylene and one or more other polymerizable units.

In the present application, the olefin-based resin may be a butyl rubber or a branched butyl rubber. An exemplary olefin-based resin is an unsaturated butyl rubber, such as a copolymer of olefin or isoolefin and multi-olefin. As the olefin-based resin included in the encapsulating composition of the present invention, poly(isobutylene-co-isoprene), polyisoprene, polybutadiene, polyisobutylene, poly(styrene-co-butadiene), natural rubber, butyl rubber, and a mixture thereof can be exemplified. The olefin-based resin useful in the present application may be prepared by any suitable means known in the art, and the present invention is not limited by this method of preparing an olefin-based resin.

In one example, the olefin-based resin may be a low molecular weight polyisobutylene resin. For example, the olefin-based resin may have a weight average molecular weight of 100,000 g/mol or less, less than 100,000 g/mol, 90,000 g/mol or less, or 70,000 g/mol or less, and the lower limit may be 500 g/mol or more, or 55,000 g/mol or more. By controlling the weight average molecular weight of the olefin-based resin in the above range, the present application can realize an encapsulating composition suitable for application and encapsulation processes. The encapsulating composition may have a liquid phase shape and may be suitably applied to side encapsulation application of an organic electronic device to be described below, and the encapsulating composition of the top encapsulation layer is also the same.

The reactive functional group contained in the olefin-based resin may be a polar functional group. In addition, the reactive functional group may have reactivity with the above-mentioned curable oligomer and/or curable monomer. The kind of the reactive functional group is not particularly limited, but may be, for example, an acid anhydride group, a carboxyl group, an epoxy group, an amino group, a hydroxyl group, an isocyanate group, an oxazoline group, an oxetane group, a cyanate group, a phenol group, a hydrazide group or an amide group. An example of the olefin-based resin having the reactive functional group may include succinic anhydride modified polyisobutylene, maleic anhydride modified liquid phase polyisobutylene, maleic anhydride modified liquid phase polyisoprene, epoxy modified polyisoprene, hydroxyl group modified liquid phase polyisoprene or allyl modified liquid phase polyisoprene. As such an olefin-based resin forms a crosslinked structure with the above-mentioned curable oligomer and/or curable monomer, the present application can realize an encapsulating composition having physical properties such as a moisture barrier property and a handling property desired in the present application.

In one example, the olefin-based resin may be included in an amount of 15 wt % or more, 18 wt % or more, 19 wt % or more, 19.5 wt % or more, or 20 wt % or more relative to the total encapsulating composition contained in the side encapsulation layer. The upper limit of the content is not particularly limited, but may be 70 wt % or less, 60 wt % or less, 50 wt % or less, 45 wt % or less, or 38 wt % or less. The present application can lower the water vapor transmission rate while decreasing the compatibility with the top encapsulation layer to realize the moisture barrier property by controlling the olefin-based resin in the above content range, and can also prevent lifting of the encapsulating structure, as the elastic modulus range is adjusted to the desired range.

In one example, the side encapsulation layer composition of the present application may comprise a curable oligomer, as described above. The oligomer may have one curable functional group or multi-functionality with two or more curable functional groups. The present application makes it possible to maintain the elasticity of the encapsulating structure while complementing the low heat durability at high temperature and high humidity of the conventional olefin-based resin by comprising the curable oligomer.

The curable oligomer may have a weight average molecular weight in a range of 400 to 50,000 g/mol, 500 to 30,000 g/mol, 800 to 10,000 g/mol, 1000 to 5000 g/mol or 1500 to 4000 g/mol. The present application can realize the desired physical properties as the side encapsulating material by comprising the oligomer having the weight average molecular weight range. In this specification, the weight average molecular weight means a value converted to standard polystyrene measured by GPC (gel permeation chromatograph).

In one example, the curable oligomer may comprise at least one or more or two or more curable functional groups. The curable functional group may comprise one or more thermosetting functional groups such as an epoxy group, a glycidyl group, an isocyanate group, a hydroxyl group, a carboxyl group or an amide group, or may comprise a curable functional group by electromagnetic wave irradiation such as a urethane group, an epoxide group, a cyclic ether group, a sulfide group, an acetal group or a lactone group. In an embodiment of the present application, the curable oligomer may comprise urethane acrylate, silicone acrylate, aliphatic acrylate or polyester acrylate, but is not limited thereto.

In one example, the curable oligomer may comprise a monofunctional oligomer and a multifunctional oligomer together. When the monofunctional and multifunctional curable oligomers are included together, the multifunctional oligomer may be included in an amount of 5 to 75 parts by weight, 7 to 68 parts by weight, 8 to 60 parts by weight, 10 to 50 parts by weight 12 to 48 parts by weight, 13 to 44 parts by weight or 14 to 42 parts by weight, relative to 100 parts by weight of the olefin-based resin. In addition, the monofunctional oligomer may be included in an amount of 3 to 35 parts by weight, 5 to 33 parts by weight, 7 to 30 parts by weight, 7.2 to 28 parts by weight, 7.3 to 26 parts by weight, 7.5 to 24 parts by weight or 7.6 to 22 parts by weight, relative to 100 parts by weight of the olefin-based resin. The present application can realize the moisture barrier property and storage stability against light exposure while complementing the low heat resistant durability at high temperature and high humidity of the conventional olefin-based resin by comprising a multifunctional acrylic oligomer and a monofunctional acrylic oligomer together with the olefin-based resin.

In an embodiment of the present application, the side encapsulation layer composition may further comprise a curable monomer, as described above. The curable monomer may have a weight average molecular weight of less than 400 g/mol, 50 to 380 g/mol or 100 to 290 g/mol. In applying a side encapsulation layer encapsulating material on a substrate, on which an organic electronic element is formed, the present application realizes excellent application properties and processability by comprising the curable monomer. In addition, as the curable monomer is included, the present application can prevent the damage applied to the element by providing the encapsulating composition in a solventless type.

In one example, the curable monomer may have a viscosity in a range of 500 cP or less, or 50 cP to 300 cP, as measured at a temperature of 25° C., a strain of 5% and a frequency of 1 Hz. In applying the side encapsulation layer composition to the periphery of the organic electronic element, the present application can secure processability by comprising the curable monomer having the viscosity range.

The material of the curable monomer is not particularly limited and may include, for example, an epoxy compound, an oxetane compound or an acrylic monomer. The acrylic monomer may include a monofunctional acrylic compound or a multifunctional acrylic compound.

In one example, as the curable monomer, an aromatic or aliphatic; or linear or branched epoxy compound may be used. In one embodiment of the present invention, an epoxy compound having an epoxy equivalent of 50 g/eq to 350 g/eq or 100 g/eq to 300 g/eq, which contains two or more functional groups, may be used. In the present application, as the curable monomer, an epoxy resin having a cyclic structure in its molecular structure can be used, and for example, an alicyclic epoxy resin can be used. The alicyclic epoxy resin can be cured without phase separation by having excellent compatibility with an olefin-based resin or a curable oligomer to achieve uniform crosslinking of the composition.

Also, the linear or branched aliphatic epoxy compound may include aliphatic glycidyl ether, 1,4-butanediol diglycidyl ether, ethylene glycol diglycidyl ether, 1,6-hexanediol diglycidyl ether, propyleneglycol diglycidyl ether, diethylene glycol diglycidyl ether, butyl glycidyl ether, 2-ethylhexyl glycidyl ether or neopentyl glycol diglycidyl ether, but is not limited thereto.

Furthermore, as long as the oxetane group compound as the curable monomer has an oxetane functional group, the structure thereof is not limited, which may be exemplified by, for example, OXT-221, CHOX, OX-SC, OXT101, OXT121, OXT221 or OXT212 from TOAGOSEI, or EHO, OXBP, OXTP or OXMA from ETERNACOLL.

In addition, as the curable monomer, the acrylic monomer may include polybutadiene dimethacrylate, 1,4-butanediol di(meth)acrylate, 1,3-butylene glycol di(meth)acrylate, 1,6-hexanediol di(meth)acrylate, 1,8-octanediol di(meth)acrylated, 1,12-dodecanediol di(meth)acrylate, neopentyl glycol di(meth)acrylate, dicyclopentanyl di(meth)acrylate, dicyclopentanyl di(meth)acrylate, cyclohexane-1,4-dimethanol di(meth)acrylate, tricyclodecane dimethanol (meth)acrylate, dimethylol dicyclopentane di(meth)acrylate, neopentyl glycol modified trimethylpropane di(meth)acrylate, adamantane di(meth)acrylate, trimethylol propane tri(meth)acrylate, or a mixture thereof.

In an embodiment of the present application, the curable monomer may be included in an amount of 5 to 200 parts by weight relative to 100 parts by weight of the olefin-based resin. The lower limit of the curable monomer content is not particularly limited, which may be 10 parts by weight or more, 15 parts by weight or more, 25 parts by weight or more, or 30 parts by weight or more. The upper limit of the curable monomer content may be, for example, 195 parts by weight or less, 150 parts by weight or less, 120 parts by weight or less, 100 parts by weight or less, 80 parts by weight or less, 45 parts by weight or less, or 40 parts by weight or less. Within the above content range, the present application can improve the application properties of the side encapsulation layer encapsulating composition and realize heat resistance holding power.

In one example, the side encapsulation layer composition may further comprise an inorganic filler. The inorganic filler may be included separately from a moisture adsorbent, which is described below, for controlling the thixotropic property of the encapsulating composition or physically adjusting a penetration length of moisture. The specific kind of the filler that can be used in the present application is not particularly limited, and for example, one of silica, calcium carbonate, alumina, talc and the like, or a mixture of two or more thereof may be used.

In the present application, in order to improve the bonding efficiency between the filler and the organic binder, a product surface-treated with an organic material may be used as the filler, or a coupling agent may be further added thereto and used.

The side encapsulation layer composition of the present application may comprise 0.1 to 70 parts by weight of an inorganic filler relative to 100 parts by weight of the olefin-based resin. The upper limit of the inorganic filler content may be, for example, 1 part by weight or more, 3 parts by weight or more, 5 parts by weight or more, 10 parts by weight or more, 18 parts by weight or more, 23 parts by weight or more, or 32 parts by weight or more. Also, the lower limit of the inorganic filler content may be, for example, 70 parts by weight or less, 60 parts by weight or less, 50 parts by weight or less, 48 parts by weight or less, 45 parts by weight or less, 43 parts by weight or less, 35 parts by weight or less, 30 parts by weight or less, or 23 parts by weight or less. By controlling the content of the inorganic filler in the above range, the present application can provide an encapsulating material in which the intended encapsulating structure shape in the present application can be easily realized.

Furthermore, the BET surface area of the inorganic filler may be in a range of 35 to 500 $m^2/g$, 40 to 400 $m^2/g$, 50 to 300 $m^2/g$, or 60 to 200 $m^2/g$. The specific surface area has been measured using the BET method, and specifically, it may be measured by adding, as a sample, 1 g of the inorganic filler to a tube with ASAP2020 (Micromeritics, USA) without pretreatment at −195° C. The average value can be obtained by measuring the same sample three times. By controlling the specific surface area of the inorganic filler in the above range, the present application can provide an encapsulating material in which the intended encapsulating structure shape in the present application can be easily realized.

In addition, in an embodiment of the present application, the side encapsulation layer composition may comprise a curing agent, if necessary. The curing agent may be a thermal curing agent or a photo-curing agent. For example, a suitable type of curing agent may be selected and used depending on the types of functional groups contained in the olefin-based resin, the curable oligomer or the curable monomer, and one or more curing agents may be used.

In one example, in the case of containing an epoxy group, the curing agent is an epoxy curing agent known in the art, and for example, one or two or more of an amine curing agent, an imidazole curing agent, a phenol curing agent, a phosphorus curing agent or an acid anhydride curing agent, and the like can be used, without being limited thereto.

In one example, as the curing agent, an imidazole compound which is solid at room temperature and has a melting point or a decomposition temperature of 80° C. or higher can be used. As such a compound, for example, 2-methylimidazole, 2-heptadecylimidazole, 2-phenylimidazole, 2-phenyl-4-methylimidazole or 1-cyanoethyl-2-phenylimidazole, and the like may be exemplified, but is not limited thereto.

In an embodiment of the present application, the curing agent may be a latent thermal curing agent such as an imidazole-isocyanuric acid adduct, an amine-epoxy adduct, a boron trifluoride-amine complex or encapsulated imidazole. That is, in the present invention, light irradiation may proceed first in the curing step of the encapsulating composition to control the initial fluidity, and the curing agent may be completely cured as a latent curing agent in a final curing step after light irradiation.

The content of the curing agent may be selected depending on the composition of the composition, for example, the kind or ratio of the resin. For example, the curing agent may be included in an amount of 1 part by weight to 100 parts by weight, 1 part by weight to 90 parts by weight or 1 part by weight to 80 parts by weight, relative to 100 parts by weight of the olefin-based resin. The weight ratio may be adjusted depending on the kind and ratio of the functional group of the olefin-based resin, the acrylic oligomer or the curable monomer, or the crosslinking density to be implemented.

In an embodiment of the present application, the side encapsulation layer composition may comprise an initiator. As the initiator, for example, a cationic initiator or a photoradical initiator may be included.

The cationic initiator may be a cationic photopolymerization initiator, and for example, ionized cationic initiators of onium salt organometallic salt series, or nonionized cationic photopolymerization initiators of organic silane or latent sulfonic acid series can be used. As the initiator of the onium salt series, diaryliodonium salt, triarylsulfonium salt or aryldiazonium salt, and the like can be exemplified, as the initiator of the organometallic salt series, iron arene and the like can be exemplified, as the initiator of the organosilane series, o-nitrobenzyl triaryl silyl ether, triaryl silyl peroxide or acyl silane, and the like can be exemplified, and as the initiator of the latent sulfuric acid series, α-sulfonyloxy ketone or α-hydroxymethylbenzoin sulfonate, and the like can be exemplified, without being limited thereto.

The radical initiator may be a photo-radical initiator. The specific kind of the photoinitiator can be appropriately selected in consideration of curing rate and yellowing possibility, and the like. For example, benzoin-based, hydroxy ketone-based, amino ketone-based or phosphine oxide-based photoinitiators, and the like can be used, and specifically, benzoin, benzoin methyl ether, benzoin ethyl ether, benzoin isopropyl ether, benzoin n-butyl ether, benzoin isobutyl ether, acetophenone, dimethylamino acetophenone, 2,2-dimethoxy-2-phenylacetophenone, 2,2-diethoxy-2-phenylacetophenone, 2-hydroxy-2-methyl-1-phenylpropan-1-one, 1-hydroxycyclohexylphenyl ketone, 2-methyl-1-[4-(methylthio)phenyl]-2-morpholino-propan-1-one, 4-(2-hydroxyethoxy)phenyl-2-(hydroxy-2-propyl) ketone, benzophenone, p-phenylbenzophenone, 4,4'-diethylaminobenzophenone, diclorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyl dimethyl ketal, acetophenone dimethyl ketal, p-dimethylaminobenzoic acid ester, oligo[2-hydroxy-2-methyl-1-[4-(1-methylvinyl)phenyl]propanone] and 2,4,6-trimethylbenzoyl-diphenyl-phosphine oxide, and the like can be used.

The content of the photo-radical initiator can be changed depending on the kind and ratio of the functional group in the radical photocurable compound, the crosslinking density to be implemented, and the like. For example, the photo-radical initiator may be compounded in a ratio of 1 part by weight to 20 parts by weight, 1.2 parts by weight to 15 parts by weight, 3 parts by weight to 12 parts by weight or 6 parts by weight to 10 parts by weight relative to 100 parts by weight of the olefin-based resin. By comprising the photo-radical initiator in the above content range, the present invention can introduce an appropriate crosslinked structure into the encapsulating composition to realize flow control at high temperature.

In one example, the initiator may comprise a cationic initiator and a radical initiator together, where the cationic initiator may be included in an amount of 0.01 to 5 parts by weight, 0.1 to 4 parts by weight, 0.3 to 2 parts by weight or 0.5 to 1.5 parts by weight relative to 100 parts by weight of the olefin-based resin and the radical initiator may be included in an amount of 0.01 to 5 parts by weight, 0.1 to 4 parts by weight, 0.3 to 2 parts by weight, or 0.5 to 1.5 parts by weight relative to 100 parts by weight of the olefin-based resin. In one example, the radical initiator content of the present application may be greater than or equal to the cationic initiator content. By controlling the above content range, the present application can realize a proper crosslinked structure in the encapsulating composition to improve heat resistant durability at high temperature and high humidity.

The side encapsulation layer composition of the present application may further comprise a moisture adsorbent. The term "moisture adsorbent" can be used to collectively mean a component capable of adsorbing or removing moisture or moisture introduced from the outside through physical or chemical reaction or the like. That is, it means a chemically reactive adsorbent or a physical adsorbent, and a mixture thereof is also usable.

The moisture-reactive adsorbent chemically reacts with humidity, moisture or oxygen, and the like introduced into the resin composition or the cured product thereof to adsorb moisture or humidity. The physical adsorbent can lengthen the moving path of moisture or humidity penetrating into the resin composition or the cured product thereof to inhibit the penetration and can maximize the barrier property against moisture or humidity through the matrix structure of the resin composition or the cured product thereof and interaction with the moisture-reactive adsorbent or the like.

In the present application, the specific kind of the usable moisture adsorbent is not particularly limited, and for example, in the case of the moisture-reactive adsorbent, it may include one or a mixture of two or more of a metal oxide, a metal salt or phosphorus pentoxide ($P_2O_5$), and the like; and in the case of the physical adsorbent, it may include zeolite, zirconia or montmorillonite, and the like.

Here, a specific example of the metal oxide may include lithium oxide ($Li_2O$), sodium oxide ($Na_2O$), barium oxide (BaO), calcium oxide (CaO) or magnesium oxide (MgO), and the like, and an example of the metal salt may include a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$), a metal halogenide such as magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), and the like, but is not limited thereto.

In the present application, the moisture adsorbent such as the metal oxide can be compounded in the composition in a properly processed state. For example, a pulverization process of the moisture adsorbent may be required, and a process such as a three-roll mill, a bead mill or a ball mill may be used for pulverizing the moisture adsorbent.

The side encapsulation layer composition of the present application may comprise the moisture adsorbent in an amount of 10 parts by weight to 150 parts by weight, 20 to 140 parts by weight, 30 parts by weight to 130 parts by weight, 33 parts by weight to 125 parts by weight, 38 parts by weight to 118 parts by weight, 42 parts by weight to 113 parts by weight, or 48 to 109 parts by weight, relative to 100 parts by weight of the olefin-based resin. As the encapsulating composition of the present application preferably controls the content of the moisture adsorbent to 10 parts by weight or more, the encapsulating composition or the cured product thereof can exhibit excellent moisture and humidity barrier properties. In addition, when the content of the moisture adsorbent is controlled to 150 parts by weight or less to form a thin film encapsulating structure, it can exhibit excellent moisture barrier properties.

In one example, the moisture adsorbent may have an average particle diameter in a range of 0.1 to 5 μm, 1 to 4 μm, or 1.5 to 3.5 μm. The particle diameter may be an average particle diameter measured according to D50 particle size analysis. The present application can comprise an excessive amount of the moisture adsorbent in the encapsulating structure while increasing the reactivity with moisture by controlling the particle diameter to improve the moisture barrier performance.

In one example, the encapsulating composition may be in a liquid phase at room temperature, for example, at about 20 to 35° C. or about 25° C. In an embodiment of the present application, the encapsulating composition may be in a solventless type liquid phase. The encapsulating composition may be applied to encapsulating an organic electronic element, and specifically, may be applied to encapsulating sides of an organic electronic element. As the encapsulating composition has a liquid form at room temperature, the present application can encapsulate an organic electronic element by a method of applying the composition to the side of the element.

In an embodiment of the present application, a process of applying a liquid composition is performed in sealing sides of an organic electronic element, whereas conventionally, there has been a problem that since the composition has high fluidity after application, it is difficult to maintain the desired encapsulation shape. In one example, the present application performs pre-curing by irradiating the encapsulating composition applied at a desired position with light, so that the final curing can proceed after the fluidity is controlled. Accordingly, the present application can keep the applied encapsulating composition in the desired encapsulated shape until final curing. The final curing may proceed with heat or light. That is, as the encapsulating composition comprises the above-described specific composition, the present application can introduce a double-curing method, whereby the flow control at high temperature is possible after the encapsulating composition is applied.

Hereinafter, the top encapsulation layer composition will be described.

The top encapsulation layer composition may comprise an epoxy compound.

The top encapsulation layer encapsulating composition of the present application is applied to the entire surface of the organic electronic element to form an encapsulating structure, where the liquid phase composition may damage the element during the application process. For example, in the organic electronic element, a protective membrane, which is described below, may be formed on the electrode, and cracks may occur in the protective film due to foreign substances such as dust on the element. These cracks may cause dark spots, and there may be a problem that the liquid phase composition penetrates between these cracks. However, the top encapsulation layer composition is applied to the entrie surface of the element to form a top encapsulation layer, and then maintains a high viscosity, whereby the present application prevents the composition from penetrating between cracks and growing the cracks.

In an embodiment of the present application, the epoxy compound may comprise a compound having a cyclic structure in its molecular structure. In one example, the epoxy compound may comprise a compound having a weight average molecular weight of 300 g/mol or less. The compound may have a weight average molecular weight in a range of 50 g/mol to 295 g/mol, 100 g/mol to 288 g/mol, or 120 g/mol to 275 g/mol. In this specification, the compound having a weight average molecular weight of 300 g/mol or less may be referred to as a low molecular weight epoxy compound. The compound having a weight average molecular weight of 300 g/mol or less may be included in an amount of 50 wt % or more, 60 wt % or more, 65 wt % or more, or 70 wt % or more in the entire top encapsulation layer composition. The upper limit of the content is not particularly limited, which may be 100 wt % or less, 90 wt % or less, or 88 wt % or less.

In another embodiment of the present application, when the top encapsulation layer further comprises a compound having a weight average molecular weight of more than 300 g/mol, the compound having a weight average molecular weight of 300 g/mol or less may be included in an amount of 20 parts by weight to 80 parts by weight, 23 to 75 parts by weight, 25 to 73 parts by weight, 28 to 68 parts by weight or 32 to 67 parts by weight, relative to 100 parts by weight of the compound having a weight average molecular weight of more than 300 g/mol. By comprising the low molecular weight epoxy compound, the present application can realize the desired viscosity after coating and minimize the curing shrinkage ratio before and after curing, while realizing excellent application properties of the encapsulating composition applied in a liquid phase.

In one example, the epoxy compound may comprise a compound having a weight average molecular weight of more than 300 g/mol and having a cyclic structure. The compound may be, for example, an aromatic (e.g., phenyl group) compound. For example, the epoxy compound of the present application may comprise a hydrogenated aromatic epoxy compound. A specific example of the compound having a cyclic structure that can be used in the present application may be a biphenyl type epoxy resin, a dicyclopentadiene type epoxy resin, a naphthalene type epoxy resin, a dicyclopentadiene modified phenol type epoxy resin, a cresol-based epoxy resin, a bisphenol-based epoxy resin, a xylox-based epoxy resin, a multifunctional epoxy resin, a phenol novolac epoxy resin, a triphenolmethane type epoxy resin and an alkyl modified triphenolmethane epoxy resin, but is not limited thereto.

In the specification, the term hydrogenated compound may mean a compound obtained by adding hydrogen to an unsaturated bond in an organic compound, for example, a multiple bond such as a carbon-carbon double bond or triple bond or a carbonyl group. Here, the hydrogenated compound may mean a compound in which all the unsaturated bonds are hydrogenated. By comprising the epoxy compound, the present application can prevent shrinkage and expansion of the encapsulating material after curing and realize excellent optical characteristics.

In this specification, the weight average molecular weight means a value converted to standard polystyrene measured by GPC (gel permeation chromatograph).

The low molecular weight epoxy compound may comprise a linear, branched or cyclic (alicyclic) epoxy compound.

The linear or branched aliphatic epoxy compound may include, for example, aliphatic glycidyl ether, 1,4-butanediol diglycidyl ether, ethylene glycol diglycidyl ether, 1,6-hexanediol diglycidyl ether, propyleneglycol diglycidyl ether, diethylene glycol diglycidyl ether, butyl glycidyl ether, 2-ethylhexyl glycidyl ether or neopentyl glycol diglycidyl ether, but is not limited thereto.

In one example, the low molecular weight epoxy compound may include a compound containing an oxetane group, and the structure thereof is not limited as long as the compound has the oxetane functional group. The compound having an oxetane functional group may be exemplified by OXT-221, CHOX, OX-SC, OXT101, OXT121, OXT221 or OXT212 from TOAGOSEI or EHO, OXBP, OXTP or OXMA from ETERNACOLL. The compound having an oxetane group may be included in an amount of 10 to 50 parts by weight or 15 to 45 parts by weight relative to 100 parts by weight of the epoxy compound.

Also, in one example, the compound having a cyclic structure in the molecular structure may be exemplified by 3,4-epoxycyclohexylmethyl 3',4'-epoxycyclohexanecarboxylate (EEC) and derivatives, dicyclopentadiene dioxide and derivatives, vinylcyclohexene dioxide and derivatives, 1,4-cyclohexanedimethanol bis(3,4-epoxycyclohexanecarboxylate) and derivatives, but is not limited thereto. The commercially available product may be exemplified by Celloxide 2021, Celloxide 2080 or Celloxide 3000 from Daicel.

In one example, the top encapsulation layer composition of the present application may comprise a thermal initiator and/or a photoinitiator. The thermal initiator or photoinitiator may be a cationic initiator. As the cationic initiator, a cationic photopolymerization initiator or a cationic thermal initiator may be used.

In one example, a material known in the art can be used as the cationic thermal initiator. For example, the cationic thermal initiator may include a compound having a cation moiety centered on an amine group and an $AsF^-$, $SbF_6^-$, $PF_6^-$, or tetrakis(pentafluorophenyl) borate anion moiety.

Also, in the case of the cationic photopolymerization initiator, a material known in the art may be used, and it may include, for example, a compound having a cation moiety including an aromatic sulfonium, an aromatic iodonium, an aromatic diazonium or an aromatic ammonium and an anion moiety including $AsF^-$, $SbF_6^-$, $PF_6^-$, or tetrakis(pentafluorophenyl) borate. Furthermore, as the cationic photopolymerization initiator, an ionized cationic initiator of onium salt or organometallic salt series or a non-ionized cationic photopolymerization initiator of organic silane or latent sulfonic acid series can be used. A diaryliodonium salt, a triarylsulfonium salt or an aryldiazonium salt and the like can be exemplified as the initiator of the onium salt series, iron arene or the like can be exemplified as the initiator of the organometallic salt series, o-nitrobenzyl triaryl silyl ether, triaryl silyl peroxide or an acyl silane and the like can be exemplified as the initiator of the organosilane series, and α-sulfonyloxy ketone or α-hydroxymethylbenzoin sulfonate and the like can be exemplified as the initiator of the latent sulfuric acid series, without being limited thereto.

In an embodiment of the present application, the thermal initiator and/or photoinitiator may be included in an amount of 0.01 to 10 parts by weight relative to 100 parts by weight of the epoxy compound. The content may be in the content range when the thermal initiator is used alone or the photoinitiator is used alone, or when they are used together. In an embodiment of the present application, the thermal initiator may be included in an amount of 0.01 to 0.45 parts by weight, 0.01 to 0.4 parts by weight, 0.01 to 0.35 parts by weight, 0.01 to 0.3 parts by weight, 0.01 to 0.25 parts by weight, or 0.01 to 0.2 parts by weight, relative to 100 parts by weight of the epoxy compound. Also, the photoinitiator may be included in an amount of 0.01 to 5 parts by weight, 0.01 to 3 parts by weight, 0.01 to 0.45 parts by weight, 0.01 to 0.4 parts by weight, 0.01 to 0.35 parts by weight or 0.01 to 0.3 parts by weight, relative to 100 parts by weight of the epoxy compound. The top encapsulation layer composition of the present application may comprise a small amount of a photoinitiator and a thermal initiator in comparison with the prior art, where the desired viscosity or hardness upon UV pre-curing can be realized in the weight ratio range, and thus it may be effective to prevent the above-described damage to the element. Furthermore, in top encapsulating the element, it is possible to provide an encapsulating material having sufficient moisture barrier properties and endurance reliability.

In an embodiment of the present application, the top encapsulation layer composition may further comprise a curing retarder. The curing retarder may be included in an amount of 0.01 to 10 parts by weight, 0.05 to 5 parts by weight, or 0.05 to 3 parts by weight, relative to 100 parts by weight of the epoxy compound. Within the above content range, the present application can improve the storage stability of the top encapsulation layer composition and can more efficiently perform photo-curing and thermal curing. The curing retarder is preferably one or more selected from the group consisting of, for example, benzylamine, cyclic polyether, boric acid, phenylboric acid, salicylic acid, hydrochloric acid, sulfuric acid, oxamic acid, tetraphthalic acid, isophthalic acid, phosphoric acid, acetic acid and lactic acid.

In an embodiment of the present application, the top encapsulation layer composition may further comprise a photosensitizer. As the photosensitizer, a known material may be used and, in one example, it may comprise an anthracene compound. As the anthracene compound, 2,3-dimethyl-9,10-diacetyloxyanthracene, 2,3-dimethyl-9,10-dipropionyloxyanthracene, 2,3-dimethyl-9,10-bis(n-butanoyloxy)anthracene, 2,3-dimethyl-9,10-bis(iso-butanoyloxy)anthracene, 2,3-dimethyl-9,10-bis(n-hexanoyloxy)anthracene, 2,3-dimethyl-9,10-bis(n-heptanoyloxy)anthracene, 2,3-dimethyl-9,10-bis(n-octanoyloxy)anthracene, 2,3-dimethyl-9,10-bis(2-ethylhexanoyloxy)anthracene, 2,3-dimethyl-9,10-bis(n-nonanoyloxy)anthracene, 2,3-dimethyl-9,10-bis(n-decanoyloxy)anthracene, 2,3-dimethyl-9,10-bis(n-dodecanoyloxy)anthracene, 2,6-dimethyl-9,10-diacetyloxyanthracene, 2,6-dimethyl-9,10-dipropionyloxyanthracene, 2,6-dimethyl-9,10-bis(n-butanoyloxy)anthracene, 2,6-dimethyl-9,10-bis(iso-butanoyloxy)anthracene, 2,6-dimethyl-9,10-bis(n-hexanoyloxy)anthracene, 2,6-dimethyl-9,10-bis(n-heptanoyloxy)anthracene, 2,6-dimethyl-9,10-bis(n-octanoyloxy)anthracene, 2,6-dimethyl-9,10-bis(2-ethylhexanoyloxy)anthracene, 2,6-dimethyl-9,10-bis(n-nonanoyloxy)anthracene, 2,6-dimethyl-9,10-bis(n-decanoyloxy)anthracene, 2,6-dimethyl-9,10-bis(n-dodecanoyloxy)anthracene, 2,7-dimethyl-9,10-diacetyloxyanthracene, 2,7-dimethyl-9,10-dipropionyloxyanthracene, 2,7-dimethyl-9,10-bis(n-butanoyloxy)anthracene, 2,7-dimethyl-9,10-bis(iso-butanoyloxy)anthracene, 2,7-dimethyl-9,10-bis(n-hexanoyloxy)anthracene, 2,7-dimethyl-9,10-bis(n-heptanoyloxy)anthracene, 2,7-dimethyl-9,10-bis(n-octanoyloxy)anthracene, 2,7-dimethyl-9,10-bis(2-ethylhexanoyloxy)anthracene, 2,7-dimethyl-9,10-bis(n-nonanoyloxy)anthracene, 2,7-dimethyl-9,10-bis(n-decanoyloxy)anthracene, 2,7-dimethyl-9,10-bis(n-dodecanoyloxy)anthracene and the like.

In one example, the top encapsulation layer composition may have excellent light transmittance for the visible light region after curing. In one example, the top encapsulation layer composition of the present application may exhibit the light transmittance of 90% or more according to JIS K7105 standard after curing. For example, the encapsulating material may have light transmittance of 92% or more, or 95% or more for the visible light region. Furthermore, the encapsulating material of the present application may exhibit low haze together with excellent light transmittance. In one example, the total top encapsulation layer composition may have haze of 5% or less, 4% or less, 3% or less, or 1% or less as measured according to JIS K7105 standard after curing. The optical characteristics may be measured at 550 nm using a UV-Vis spectrometer.

In one example, the total encapsulation layer composition of the present application may have a volatile organic compound amount of 50 ppm or less, 30 ppm or less, or 10 ppm or less as measured after curing. The lower limit is not particularly limited, but may be 0 ppm or more or 0.1 ppm or more. In this specification, the volatile organic compound may be referred to as outgas. After the composition is cured and then a sample of the cured product is held at 110° C. for 30 minutes, the volatile organic compound may be measured using Purge & Trap-gas chromatography/mass spectrometry. The measurement may be performed using a Purge & Trap sampler (JAI JTD-505 III)-GC/MS (Agilent 7890b/5977a) instrument.

The top encapsulation layer or side encapsulation layer composition according to the present application may comprise various additives within the range without affecting the above-mentioned effects of invention, in addition to the above-mentioned configurations. For example, the resin composition may comprise a defoamer, a coupling agent, a tackifier, a ultraviolet stabilizer or an antioxidant, and the like in an appropriate range of content depending on the desired physical properties. In one example, the encapsulating composition may further comprise a defoamer. By comprising the defoamer, the present application can realize defoaming characteristics in the above-described process of applying the encapsulating composition to provide a reliable encapsulating structure. Also, the kind of the defoamer is not particularly limited as long as the physical properties of the encapsulating composition required in the present application are satisfied.

In one example, the encapsulating composition may be a pressure-sensitive adhesive composition or an adhesive composition. Accordingly, the encapsulating composition can also serve as a structural adhesive for attaching a cover substrate to the substrate on which the organic electronic element is formed.

The top encapsulation layer and the side encapsulation layer may be present on the same plane. Here, the "same" may mean substantially the same. For example, in the same plane, the substantially the same means that it may have an error within ±5 µm or ±1 µm in the thickness direction. The top encapsulation layer can seal the upper surface of the element, and can seal the side surfaces together as well as the upper surface. The side encapsulation layer may be formed on the side surface of the element, but may not directly contact the side surface of the organic electronic element. For example, the top encapsulation layer can be sealed so as to directly contact with the upper surface and side surfaces of the element. That is, the side encapsulation layer may be located, in the plan view of the organic electronic device, at the periphery of the substrate without contacting the element.

In this specification, the term "periphery" means the edge portion of the perimeter. That is, the periphery of the substrate herein may mean the edge portion of the perimeter in the substrate.

In one example, the organic electronic element may comprise a reflective electrode layer formed on a substrate, an organic layer formed on the reflective electrode layer and including at least a light emitting layer, and a transparent electrode layer formed on the organic layer.

In the present application, the organic electronic element (23) may be an organic light emitting diode.

In one example, the organic electronic device according to the present application may be in a top emission type, but is not limited thereto, and may be applied to a bottom emission type.

The organic electronic element may further comprise a protective membrane (passivation membrane) for protecting an electrode between the top encapsulation layer or the side encapsulation layer and the electrode of the element. The protective membrane may be in the form of alternately laminating an organic membrane and an inorganic membrane. In one example, the inorganic membrane may be one or more metal oxides or nitrides selected from the group consisting of Al, Zr, Ti, Hf, Ta, In, Sn, Zn and Si. The inorganic membrane may have a thickness of 0.01 µm to 50 µm or 0.1 µm to 20 µm or 1 µm to 10 µm. In one example, the inorganic membrane of the present application may be an inorganic material that does not include a dopant, or may be an inorganic material containing a dopant. The dopant which can be doped is one or more elements selected from the group consisting of Ga, Si, Ge, Al, Sn, Ge, B, In, Tl, Sc, V, Cr, Mn, Fe, Co and Ni, or an oxide of the element, but is not limited thereto.

The present application also relates to a method for manufacturing an organic electronic device.

In one example, the manufacturing method may comprise steps of applying a side encapsulation layer composition on the periphery of a substrate (21) on which an organic electronic element (23) is formed so as to surround the side surfaces of the organic electronic element (23) and applying a top encapsulation layer composition so as to encapsulate the entire surface of the electronic element (23). The order of the step of forming the side encapsulation layer and the step of forming the top encapsulation layer is not particularly limited, where the side encapsulation layer may also be formed after the top encapsulation layer is formed first.

Specifically, the manufacturing method may comprise a step of curing the side encapsulation layer or the top encapsulation layer. The step of curing the encapsulation layer may comprise a step of irradiating it with light and/or a step of applying heat. In one example, the encapsulation layer can be cured through only one step of light irradiation, but is not so limited thereto, and may comprise a pre-curing step and a final curing step. The pre-curing step may comprise irradiating it with light, and the final curing step may comprise irradiating it with light or applying heat.

Here, the substrate (21) on which an organic electronic element (23) is formed may be produced by forming a reflective electrode or a transparent electrode on a substrate (21) such as glass or a film by a method such as vacuum deposition or sputtering, and forming an organic material layer on the reflective electrode. The organic material layer may comprise a hole injecting layer, a hole transporting layer, a light emitting layer, an electron injecting layer and/or an electron transporting layer. Subsequently, a second electrode is further formed on the organic material layer. The second electrode may be a transparent electrode or a reflective electrode. Then, the above-described side encapsulation layer (10) is applied on the periphery of the substrate (21) so as to cover the side of the organic electronic element (23). At this time, the method of forming a side encapsulation layer (10) is not particularly limited, and the above-described encapsulating composition may be applied on the side of the substrate (21) using a process such as screen printing or dispenser applying. Furthermore, a top encapsulation layer (11) for encapsulating the entire surface the organic electronic element (23) can be applied. As the method of forming a top encapsulation layer (11), a known method in the art can be applied, and for example, a liquid drop injection (one drop fill) process can be used.

In addition, in the present invention, a curing process may also be performed on the top or side encapsulation layer for sealing the organic electronic element, where this curing process (final curing) may proceed, for example, in a heating chamber or a UV chamber, and preferably in both. The conditions upon the final curing can be appropriately selected in consideration of the stability of the organic electronic device, and the like.

In one example, after the above-described encapsulating composition is applied, the composition may be irradiated with light to induce crosslinking. The light irradiation may comprise irradiating it with light having a wavelength range of the UV-A region band at a light quantity of 0.3 to 6 J/cm$^2$ or a light quantity of 0.5 to 4 J/cm$^2$. As described above, it is possible to realize an encapsulating structure shape that can become a basis by pre-curing it through irradiation of light.

In one example, the manufacturing method may comprise finally curing the encapsulating composition pre-cured after light irradiation. The final curing may further comprise heat-curing it at a temperature of 40° C. to 200° C., 50° C. to 150° C. or 70° C. to 120° C. for 1 hour to 24 hours, 1 hour to 20 hours, 1 hour to 10 hours or 1 hour to 5 hours. Also, the final curing may comprise irradiating it with light having a wavelength range of the UV-A region band at a light quantity of 0.3 to 6 J/cm$^2$ or a light quantity of 0.5 to 4 J/cm$^2$. The final curing of the encapsulating composition may proceed through the step of applying heat or the step of irradiating it with light.

Advantageous Effects

The present application provides an organic electronic device which can form an encapsulating structure capable of effectively blocking water or oxygen introduced from the outside into the organic electronic device, thereby securing the lifetime of the organic electronic device and realizing endurance reliability of the encapsulating structure at high temperature and high humidity, and has high shape retention characteristics.

BRIEF DESCRIPTION OF DRAWINGS

FIG. 1 is a cross-sectional view showing an organic electronic device according to one example of the present invention.

EXPLANATION OF NUMERICAL REFERENCES

1: encapsulating structure
10: side encapsulation layer
11: top encapsulation layer
21: substrate
22: cover substrate
23: organic electronic element

BEST MODE

Hereinafter, the present invention will be described in more detail by way of examples according to the present invention and comparative examples not according to the present invention, but the scope of the present invention is not limited by the following examples.

Side Encapsulation Layer Composition

Hereinafter, in Examples and Comparative Examples, as the olefin-based resin, polybutylene (Daelim, HRPB 2300), polyisobutylene (BASF, B10), and an acid anhydride-modified polyisobutylene resin (BASF, Mn 1000 g/mol, Glissopal SA, hereinafter, PIBSA) were used. As the curable oligomer, epoxy acrylate (Sartomer, CN110, Mw 870 g/mol) and urethane acrylate (Sartomer, CN8003, Mw: 28,000 g/mol) were used and as the curable monomer, an acrylic monomer (Sartomer, SR335, 240.38 g/mol) and an alicyclic epoxy resin (Daicel, Celloxide 2021P, epoxy equivalent: 130 g/eq, Mw: 270 g/mol, viscosity: 250 cPs, hereinafter, C2021P) were used. Also, as the epoxy compound, bisphenol F epoxy (DIC, Epiclon 830, epoxy equivalent 175 g/eq, Mw=350 g/mol) was used. As the inorganic filler, fumed silica (Aerosil, Evonik, R805, particle size 10 to 20 nm, BET=150 m$^2$/g) was used and as the moisture adsorbent, calcium oxide (CaO, average particle diameter 5 μm, Aldrich) was used. As the photoinitiator, a photo-cationic initiator (San-apro, CPI-101A) and a radical initiator (BASF, Irgacure 819) were used.

Top Encapsulation Layer Composition

As the epoxy compound, an alicyclic epoxy resin (Daicel, Celloxide 2021P, epoxy equivalent: 130 g/eq, Mw: 270 g/mol, viscosity: 250 cPs, hereinafter, C2021P), a bisphenol A epoxy resin (DIC, Epiclon 840, epoxy equivalent: 180-190 g/eg, Mw: 360-380 g/mol), an oxetane compound (TOAGOSEI, OXT-221, Mw: 214.3 g/mol) and an oxetane compound (TOAGOSEI, OXT212, Mw: 228.4 g/mol) were used. As the cationic photoinitiator, Irgacure 290 from BASF was used, as the cationic thermal initiator, CXC-1612 from King Industries Inc. was used, and as the photosensitizer, ITX, an anthracene compound, was used.

Examples 1 to 5 and Comparative Examples 1 to 2

For the above composition, components were compounded in the weight ratios as shown in Table 1 below and introduced into a mixing vessel. The unit is parts by weight. In the mixing vessel, uniform composition solutions were prepared using a planetary mixer (Kurabo, KK-250 s) to prepare the side encapsulation layer composition and the top encapsulation layer composition, respectively.

TABLE 1

|  |  | Example | | | | | Comparative Example | |
|---|---|---|---|---|---|---|---|---|
|  |  | 1 | 2 | 3 | 4 | 5 | 1 | 2 |
| Side encapsulation layer | HRPB2300 | 35 |  |  | 35 |  |  |  |
|  | B10 |  |  | 20 |  |  |  |  |
|  | PIBSA |  | 40 |  |  | 19 |  | 42 |
|  | CN8003 | 25 | 15 | 13 | 25 | 30 |  | 17 |
|  | CN110 |  |  |  |  |  | 20 |  |
|  | SR335 | 2 | 5 | 30 | 2 | 5 |  | 7 |
|  | C2021P | 10 | 9 | 8 | 10 | 17 |  | 11 |

TABLE 1-continued

|  |  | Example | | | | | Comparative Example | |
|---|---|---|---|---|---|---|---|---|
|  |  | 1 | 2 | 3 | 4 | 5 | 1 | 2 |
|  | Epiclon830 |  |  |  |  |  | 60 |  |
|  | CaO | 20 | 20 | 20 | 20 | 20 | 20 | 20 |
|  | R805 | 7 | 10 | 8 | 7 | 8 | 10 | 2 |
|  | CPI-101A | 0.5 | 0.5 | 0.5 | 0.5 | 0.5 | 1 | 0.5 |
|  | Irg819 | 0.5 | 0.5 | 0.5 | 0.5 | 0.5 | 0.5 | 0.5 |
| Top encapsulation layer | C2021P | 100 | 85 | 70 |  | 70 | 80 | 100 |
|  | Epiclon840 |  |  |  | 100 |  |  |  |
|  | OXT-221 |  |  |  | 10 |  |  |  |
|  | OXT-212 |  | 15 | 20 |  | 20 | 15 |  |
|  | Irg290 | 1 | 1 | 1 | 1 | 1 | 1 | 1 |
|  | CXC-1612 |  |  | 0.1 |  | 0.1 |  |  |
|  | ITX | 0.1 | 0.1 | 0.1 | 0.1 | 0.1 | 0.1 | 0.1 |

Hereinafter, the properties of the encapsulating compositions prepared in Examples and Comparative Examples were evaluated in the following manner.

1. Viscosity Measurement

In the encapsulating compositions prepared in Example or Comparative Examples, the viscosity values at 0.5 sec$^{-1}$ were measured by using ARES G2 from TA Corporation and using a 25 mm aluminum cone & plate. The measurement temperature is 25° C., and the cell gap is 0.1 mm 2. Measurement of Tensile Modulus A certain amount of each of the encapsulating compositions prepared in Examples or Comparative Examples is applied to the released PET, the released PET is covered, and then the composition is pressed and spread by a weight of 1 kg. Then, after UV irradiation (metal halide lamp 3 J/cm$^2$), a specimen cured at 100° C. for 1 hour is made, and its tensile modulus is measured with a tensile machine (TA-XT2 Plus). The measurement temperature was 25° C., and it was measured at a rate of 10 mm/min.

3. Bonding Property

The encapsulating compositions prepared in Examples or Comparative Examples are each applied to an OLED panel on which an inorganic vapor deposition membrane is formed. The side encapsulation layer composition is applied to the edge part of the OLED element and the top encapsulation layer is applied to cover the element. Thereafter, they were bonded together (cell gap 10 μm, side encapsulation layer width 5 mm) and cured at 100° C. for 1 hour after UV irradiation (metal halide lamp 3 J/cm$^2$), and the element stepped portion on the substrate was observed with a microscope, where in the case of being no bubble at the stepped site, it was classified as ○; in the case of forming 1 to 2 bubbles, it was classified as Δ; and in the case of being 3 or more bubbles, it was classified as X.

4. Interface Elution

The encapsulating compositions prepared in Examples or Comparative Examples are each applied to an OLED panel on which an inorganic vapor deposition membrane is formed. The side encapsulation layer composition is applied to the edge part of the OLED element and the top encapsulation layer is applied to cover the element. Thereafter, they were bonded together (cell gap 10 μm, side encapsulation layer width 5 mm) and allowed to stand at 25° C. for 1 hour without curing.

When the side encapsulation layer composition spread to be 0.1 to 1 mm at the boundary region between the side encapsulation layer and the top encapsulation layer, it was classified as Δ; when the side encapsulation layer composition spread to be more than 1 mm at the boundary region, it was classified as X; and when the side encapsulation layer and the top encapsulation layer were not mixed at all, it was classified as ○.

4. Moisture-Resistant Reliability

The encapsulating compositions prepared in Examples or Comparative Examples are each applied to an OLED panel on which an inorganic vapor deposition membrane is formed. The side encapsulation layer composition is applied to the edge part of the OLED element and the top encapsulation layer is applied to cover the element. Thereafter, they were bonded together (cell gap 10 μm, side encapsulation layer width 5 mm) and cured at 100° C. for 1 hour after UV irradiation (metal halide lamp 3 J/cm$^2$).

Thereafter, the OLED panel was maintained in a constant temperature and humidity chamber at 85° C. and 85% relative humidity for about 1000 hours.

When the OLED element shrank due to moisture penetration and the encapsulation layer lifted, it was represented by X; and when there was no shrinkage and lifting phenomenon, it was represented by 0.

TABLE 2

|  |  | Side Encapsulation layer | | Top Encapsulation layer | | | | |
|---|---|---|---|---|---|---|---|---|
|  |  | Viscosity (cP) | Tensile Modulus (MPa) | Viscosity (cP) | Tensile Modulus (MPa) | Bonding Property | Interface Elution | Moisture-resistant Reliability |
| Example | 1 | 380,000 | 40 | 250 | 1100 | ○ | ○ | ○ |
|  | 2 | 470,000 | 3 | 98 | 980 | ○ | ○ | ○ |
|  | 3 | 420,000 | 67 | 82 | 950 | ○ | ○ | ○ |
|  | 4 | 380,000 | 40 | 10,000 | 1,000 | Δ | ○ | ○ |
|  | 5 | 320,000 | 82 | 82 | 950 | ○ | Δ | ○ |

TABLE 2-continued

| | | Side Encapsulation layer | | Top Encapsulation layer | | | | |
|---|---|---|---|---|---|---|---|---|
| | | Viscosity (cP) | Tensile Modulus (MPa) | Viscosity (cP) | Tensile Modulus (MPa) | Bonding Property | Interface Elution | Moisture-resistant Reliability |
| Comparative Example | 1 | 450,000 | 750 | 98 | 980 | ○ | Δ | X |
| | 2 | 140,000 | 1.5 | 250 | 1,100 | ○ | X | ○ |

The invention claimed is:

1. An organic electronic device comprising a substrate on which an organic electronic element is formed; a top encapsulation layer encapsulating the entire surface of the organic electronic element; and a side encapsulation layer disposed on the edge of the substrate,
wherein a top surface of the top encapsulation layer is in the same plane with a top surface of the side encapsulation layer, and
wherein the side encapsulation layer has a tensile modulus of 0.05 MPa to 100 MPa at 25° C. after curing, the top encapsulation layer has a tensile modulus of 100 MPa or more at 25° C. after curing, and the ratio of the tensile modulus of the top encapsulation layer to the tensile elastic modulus of the side encapsulation layer is in a range of 5 to 400.

2. The organic electronic device according to claim 1, wherein the side encapsulation layer comprises an encapsulating composition having a viscosity of 300,000 cP or more as measured at 25° C. and 0.5 $s^{-1}$ before curing, and the top encapsulation layer has a viscosity of 5,000 cP or less as measured at 25° C. and 0.5 $s^{-1}$ before curing.

3. The organic electronic device according to claim 2, wherein the ratio of the viscosity of the top encapsulation layer composition to the viscosity of the side encapsulation layer composition is in a range of 1.5 to 15.

4. The organic electronic device according to claim 1, wherein the side encapsulation layer comprises an olefin-based resin, a curable oligomer and a curable monomer.

5. The organic electronic device according to claim 4, wherein the olefin-based resin has a weight average molecular weight of 100,000 or less.

6. The organic electronic device according to claim 4, wherein the curable oligomer is comprised in an amount of 20 to 90 parts by weight relative to 100 parts by weight of the olefin-based resin.

7. The organic electronic device according to claim 4, wherein the curable oligomer has a glass transition temperature of 85° C. or lower after curing.

8. The organic electronic device according to claim 4, wherein the curable oligomer has a weight average molecular weight in a range of 400 g/mol to 50,000 g/mol.

9. The organic electronic device according to claim 4, wherein the curable monomer has a weight average molecular weight of less than 400 g/mol.

10. The organic electronic device according to claim 4, wherein the curable monomer is comprised in an amount of 5 to 200 parts by weight relative to 100 parts by weight of the olefin-based resin.

11. The organic electronic device according to claim 4, wherein the side encapsulation layer further comprises an inorganic filler.

12. The organic electronic device according to claim 11, wherein the inorganic filler is comprised in an amount of 0.1 parts by weight to 70 parts by weight relative to 100 parts by weight of the olefin-based resin.

13. The organic electronic device according to claim 4, wherein the side encapsulation layer further comprises a cationic initiator or a radical initiator.

14. The organic electronic device according to claim 4, wherein the side encapsulation layer further comprises a moisture adsorbent.

15. The organic electronic device according to claim 14, wherein the moisture adsorbent is comprised in an amount of 10 to 150 parts by weight relative to 100 parts by weight of the olefin-based resin.

16. The organic electronic device according to claim 1, wherein the top encapsulation layer comprises an epoxy compound.

17. The organic electronic device according to claim 16, wherein the epoxy compound comprises a compound having a cyclic structure in its molecular structure.

18. The organic electronic device according to claim 1, wherein the top encapsulation layer further comprises a photoinitiator or a thermal initiator.

19. The organic electronic device according to claim 1, wherein the top encapsulation layer further comprises a photosensitizer.

20. A method for manufacturing an organic electronic device comprising steps of applying a side encapsulation layer composition on the periphery of a substrate on which an organic electronic element is formed so as to surround the side surfaces of the organic electronic element and applying a top encapsulation layer composition so as to encapsulate the entire surface of the organic electronic element,
wherein a top surface of the top encapsulation layer is in the same plane with a top surface of the side encapsulation layer, and
wherein the side encapsulation layer has a tensile modulus of 0.05 MPa to 100 MPa at 25° C. after curing, the top encapsulation layer has a tensile modulus of 100 MPa or more at 25° C. after curing, and the ratio of the tensile modulus of the top encapsulation layer to the tensile elastic modulus of the side encapsulation layer is in a range of 5 to 400.

* * * * *